(12) United States Patent
Zundel et al.

(10) Patent No.: US 10,340,227 B2
(45) Date of Patent: Jul. 2, 2019

(54) METHOD FOR PROCESSING A DIE

(71) Applicant: Infineon Technologies AG, Neubiberg (DE)

(72) Inventors: Markus Zundel, Egmating (DE); Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/071,375

(22) Filed: Mar. 16, 2016

(65) Prior Publication Data
US 2016/0284648 A1 Sep. 29, 2016

(30) Foreign Application Priority Data
Mar. 26, 2015 (DE) .................. 10 2015 104 570

(51) Int. Cl.
*H01L 23/498* (2006.01)
*H01L 23/00* (2006.01)
*H01L 23/532* (2006.01)
*H01L 23/528* (2006.01)
*C22C 19/03* (2006.01)

(52) U.S. Cl.
CPC .......... *H01L 23/562* (2013.01); *C22C 19/03* (2013.01); *H01L 24/32* (2013.01); *H01L 2224/32225* (2013.01); *H01L 2924/0105* (2013.01); *H01L 2924/01007* (2013.01); *H01L 2924/01013* (2013.01); *H01L 2924/01028* (2013.01); *H01L 2924/01029* (2013.01); *H01L 2924/0132* (2013.01); *H01L 2924/01047* (2013.01); *H01L 2924/01078* (2013.01); *H01L 2924/01079* (2013.01); *H01L 2924/2011* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01); *H01L 2924/3511* (2013.01)

(58) Field of Classification Search
CPC .............................. H01L 23/562; C22C 19/03
USPC .......................................................... 257/768
See application file for complete search history.

(56) References Cited

U.S. PATENT DOCUMENTS

| | | | | |
|---|---|---|---|---|
| 5,171,348 A | * | 12/1992 | Umetani | ............... B32B 15/018 65/26 |
| 9,650,723 B1 | * | 5/2017 | D'Evelyn | ............... C30B 7/105 |
| 2002/0058374 A1 | * | 5/2002 | Kim | ................ H01L 21/823842 438/228 |
| 2002/0079576 A1 | | 6/2002 | Seshan | |
| 2004/0104491 A1 | * | 6/2004 | Connell | .................. H01L 21/78 257/787 |
| 2005/0026332 A1 | * | 2/2005 | Fratti et al. | ......... H01L 23/3171 257/618 |

(Continued)

FOREIGN PATENT DOCUMENTS

| | | |
|---|---|---|
| DE | 102012104948 A1 | 12/2012 |
| JP | 2005033130 A | 2/2005 |
| JP | 2010205991 A | 9/2010 |

*Primary Examiner* — Moazzam Hossain
(74) *Attorney, Agent, or Firm* — Viering, Jentschura & Partner MBB

(57) ABSTRACT

In various embodiments, a die is provided. The die may include a die body, and at least one of a front side metallization structure on a front side of the die body and a back side metallization structure on a back side of the die body such that the die is plane or includes a positive radius of curvature at a die attach process temperature range.

19 Claims, 8 Drawing Sheets

(56) References Cited

U.S. PATENT DOCUMENTS

| | | | |
|---|---|---|---|
| 2006/0199310 A1* | 9/2006 | Nakabayashi | H01L 21/76834 438/128 |
| 2007/0205464 A1* | 9/2007 | Sander | G01K 3/005 257/350 |
| 2010/0013008 A1* | 1/2010 | Oikawa | H01L 29/41741 257/329 |
| 2010/0090322 A1* | 4/2010 | Hedler | H01L 23/3114 257/676 |
| 2010/0240213 A1 | 9/2010 | Urano et al. | |
| 2011/0256668 A1 | 10/2011 | Urano | |
| 2011/0284958 A1* | 11/2011 | Haeberlen | H01L 29/0649 257/343 |
| 2012/0146024 A1* | 6/2012 | Lysacek | H01L 21/3221 257/52 |
| 2012/0313230 A1 | 12/2012 | Mengel et al. | |
| 2013/0271169 A1* | 10/2013 | Colvin | G01R 1/44 324/750.03 |
| 2014/0020743 A1* | 1/2014 | Konno | H01B 1/22 136/256 |
| 2014/0091470 A1* | 4/2014 | Sane | H01L 24/32 257/770 |
| 2014/0196781 A1* | 7/2014 | Ito | H01L 31/022425 136/256 |
| 2014/0299218 A1* | 10/2014 | Hirth | B21C 37/20 138/121 |
| 2016/0020284 A1* | 1/2016 | D'Evelyn | H01L 29/2003 428/64.1 |

* cited by examiner

METHOD FOR PROCESSING A DIE

CROSS-REFERENCE TO RELATED APPLICATION

This application claims priority to German Patent Application Serial No. 10 2015 104 570.2, which was filed Mar. 26, 2015, and is incorporated herein by reference in its entirety.

TECHNICAL FIELD

Various embodiments relate generally to a method for processing a die. Furthermore, various embodiments relate to a method for processing a die which may improve the quality of die attachment.

BACKGROUND

There are four major processes for die attach, namely the metal-filled polymeric die attach, metal/frit die attach, eutectic bond die attach and solder-based die attach. Among these processes, the solder-based die attach is widely used because it is highly reliable with ease of processing. Furthermore, the solder used in the solder-based die attach process has excellent thermal and electrical conductivity, as well as low coefficient of thermal expansion (CTE) mismatch.

However, voiding in the solder has been a problem encountered in the solder-based die attach process. Voiding is a result of various parameters of the solder-based die attach process, such as flux activity (e.g., out-gassing), choice of alloy and deposit size. If voids are present at the interface of the solder and back side metallization of a chip, delamination of the chip from the solder may occur. Furthermore, the presence of the void also reduces thermal and electrical conductivity, resulting in higher electrical resistance and poor heat dissipation. Therefore, when the chip is in operation, it invariably heats up locally at the vicinity of the void due to poor heat dissipation. As a consequence, the chip may be damaged during operation. These problems may be more prominent for power devices which operate at larger current.

Therefore, there is a need for an improved process that addresses the above-mentioned challenges.

SUMMARY

In various embodiments, a die is provided. The die may include a die body, and at least one of a front side metallization structure on a front side of the die body and a back side metallization structure on a back side of the die body such that the die is plane or includes a positive radius of curvature at a die attach process temperature range.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical and electrical changes may be made without departing from the scope of the invention. The various embodiments are not mutually exclusive, as some embodiments can be combined with one or more other embodiments to form new embodiments. The following detailed description therefore is not to be taken in a limiting sense, and the scope of the present invention is defined by the appended claims.

Various embodiments are provided for methods, and various embodiments are provided for devices. It will be understood that basic properties of the methods also hold for the devices and vice versa. Therefore, for the sake of brevity, duplicate description of such properties may be omitted.

The term "at least one" as used herein may be understood to include any integer number equal to or greater than one, i.e., "one", "two", "three", . . . etc.

The term "a plurality" as used herein may be understood to include any integer number equal to or greater than two, i.e., "two", "three", "four", . . . etc.

Unless otherwise stated, the term "layer" as used herein may be understood to include embodiments where a layer is a single layer, as well as embodiments where a layer is a layer stack including a plurality of sublayers.

The word "exemplary" is used herein to mean "serving as an example, instance or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g., in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
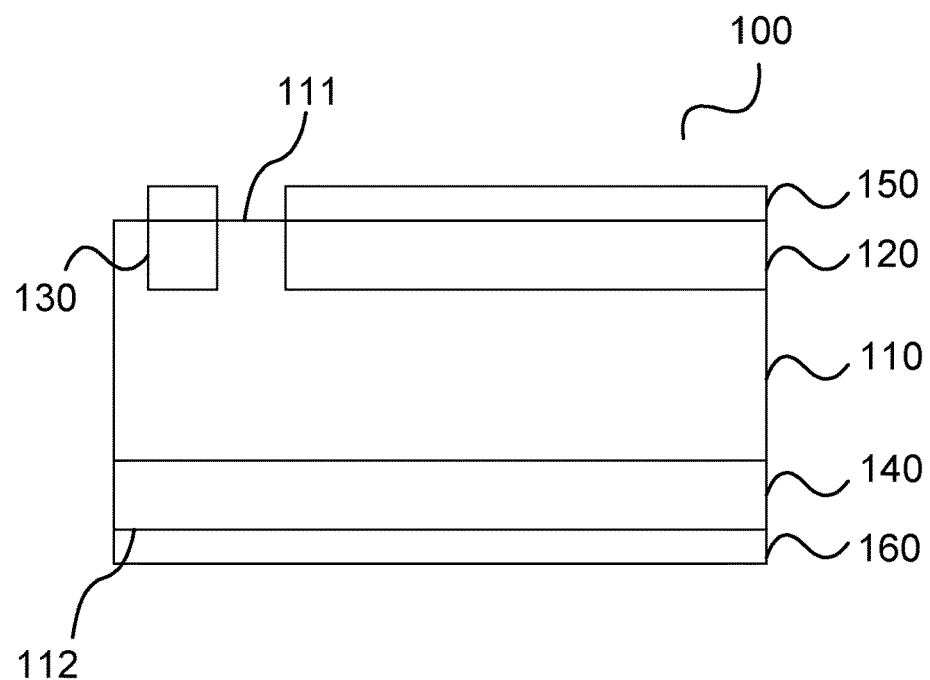
FIG. 1 shows an exemplary cross-sectional view of an embodiments of a device.

FIG. 1 shows an exemplary cross-sectional view of an embodiments of a device 100. The device may, for example, be a semiconductor device, such as a semiconductor die of an integrated circuit (IC) or a chip. It will be understood that the terms "die" and "chip" are used interchangeably herein. The IC may be any type of IC. For example, the IC may be power ICs or power chips including power diodes, thyristors, power MOSFET, insulated gate bipolar transistors (IGBTs) as well as other types of devices or a combination thereof. A power IC, for example, operates on similar principles as its low power counterpart. However, a power IC is able to carry a larger amount of current and support a larger reverse bias voltage in the off-state.

Referring to FIG. 1, the device may include a substrate 110 having a first surface 111 and a second surface 112. The substrate 110 may, for example, be a semiconductor substrate, such as a silicon substrate. Other type of substrates, for example, SiGe, SiGeC or SiC, may also be used. In various embodiments, the substrate 110 may be a crystalline-on-insulator (COI), such as a silicon-on-insulator (SOI) substrate. Other types of COI substrates may also be used. The substrate 110 may, for example, be a doped or undoped substrate. In various embodiments, the substrate 110 may have a thickness of less than about 100 µm, for example, about 60 µm.

The first surface 111 may, for example, be a top surface of the substrate 110. The top surface is also known as the front side of a device, e.g., a die or a chip. In various embodiments, the top surface may be a processed substrate surface. For example, the top surface may include at least one active region. The active region may include a doped region 120 and a gate region 130. The doped region 120 may, for example, include dopants of a first type. The first type dopants may be p-type dopants. For example, the doped region may include p-type dopants such as boron (B), aluminum (Al) or a combination thereof. Alternatively, the first type dopants may be n-type dopants, such as phosphorus (P), arsenic (As), antimony (Sb) or a combination thereof. In various embodiments, the doped region 120 corresponds to a diffusion region (e.g., source and drain) of a device, e.g., a power MOSFET, and the gate region 130 corresponds to a gate of the device.

A front side metallization structure 150 may be disposed on the first surface 111 of the substrate 110. The front side metallization structure 150 may be a layer, a stack of multiple sublayers or a plurality of stacks, each stack has multiple sublayers. In various embodiments, the front side metallization structure 150 may be disposed over the active region. The front side metallization structure 150 may be formed of a metal or a metal alloy. The front side metallization structure 150 may be copper (Cu), tin (Sn), aluminum (Al), gold (Au), silver (Ag), nickel (Ni), platinum (Pt), their alloys, or a combination thereof. In various embodiments, the front side metallization structure 150 may be a copper layer. The front side metallization structure 150 may, for example, be the source electrode and gate electrode of the device.

The second surface 112 may, for example, be a bottom surface of the substrate 110, opposite to the first surface 111. The bottom surface is also known as the back side of a device, e.g., a die or a chip. In various embodiments, the bottom surface may be a processed substrate surface. For example, the bottom surface may include at least one active region. The active region may include a doped region 140. The doped region may, for example, include dopants of a first type. The first type dopants may be p-type dopants. For example, the doped region may include p-type dopants such as boron (B), aluminum (Al) or a combination thereof. Alternatively, the first type dopants may be n-type dopants, such as phosphorus (P), arsenic (As), antimony (Sb) or a combination thereof. In various embodiments, the doped region corresponds to a diffusion region (e.g., source and drain) of the device.

A back side metallization structure 160 may be disposed on the second surface 112 of the substrate 110. The back side metallization structure 160 may be a layer, a stack of multiple sublayers or a plurality of stacks, each stack has multiple sublayers. In various embodiments, the back side metallization structure 160 may be disposed over the active region. The back side metallization structure 160 may be formed of a metal or a metal alloy. The back side metallization structure 160 may be copper (Cu), tin (Sn), aluminum (Al), gold (Au), silver (Ag), nickel (Ni), platinum (Pt), their alloys, or a combination thereof. In various embodiments, the back side metallization structure 160 may be a nickel vanadium (NiV) layer. The back side metallization structure 160 may, for example, be the drain electrode of the device.

In various embodiments, the front side and back side metallization structures can be the same or different materials.

Temperature as high as 400° C. is often employed in the solder-based die attach process to attach the device to a carrier, e.g., a printed circuit board (PCB). Under such a high temperature of the die attach process, out-gassing of the flux may form gas bubbles in the solder. At the same time, the chip (or die) may undergo a change in geometry, deviating from its planar state due to the stress exerts by the front side and back side metallization structures.

Figure 2:
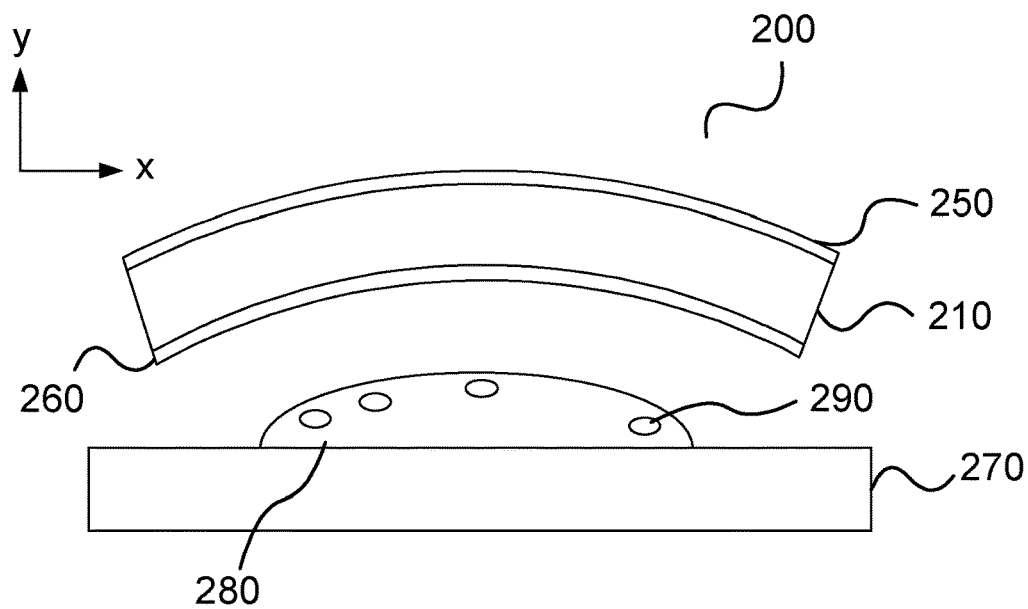
FIG. 2 shows an exemplary cross-sectional view of a device having a convex shape and solder on a carrier during die attach process.

FIG. 2 shows an exemplary cross-sectional view of a downwardly bending chip having a convex shape and a molten solder on a carrier during a die attach process. The front side metallization structure 250 and the back side metallization structure 260 may have a higher coefficient of thermal expansion (CTE) than the CTE of the substrate 210. Therefore, during a die attach process which may be carried out at a temperature from about 150° C. to about 400° C., the front side metallization structure 250 and the back side metallization structure 260 may expand macroscopically more than the substrate 210. However, the front side metallization structure 250 and the back side metallization structure 260 may be constrained by the substrate 210 because the substrate 210 has a smaller CTE. As a result, the front side metallization structure 250 and the back side metallization structure 260 may be under compression during the die attach process. That is, the front side and back side metallization structures "want" to expand during the die attach process. The presence of the stress in the front side and the back side metallization structures disposed on the substrate 210 may induce a bending of the substrate 210.

Conventionally, the compressive stress exerted by the front side metallization structure 250 onto the substrate 210 may be more dominant than the compressive stress exerted by the back side metallization structure 260 onto the substrate 210 during a die attach process which may be carried out at a temperature from about 150° C. to about 400° C. As a result, the chip 200 may deviate from its initial planar state, forming a dome over the molten solder 280 which is disposed on a carrier 270 (e.g., a PCB) at the die attach process.

Assuming the length of the chip is in the x direction and the height is in the y direction according to the Cartesian coordinate system, the deformed chip 200 may bend downwardly towards the negative y direction, e.g., the center of the chip 200 is further away from the carrier 270 than the edges of the chip. The deformed chip may adopt a convex shape as seen from the front side of the chip. Assuming the chip locates in between a center of curvature and the carrier 270, the radius of curvature of the deformed chip is therefore negative, as the chip bends downwardly towards the negative y direction. That is, the deformed chip 200 may have a negative radius of curvature during the die attach process which is carried out at a specific temperature range, e.g., 150° C. to 400° C.

Due to the gas flow and pressure created by the overhead dome formed by the convex chip, the gas bubbles 290 may not be able to escape from the molten solder 280 upwardly and outwardly during the die attach process. Consequently, the gas bubbles 290 may be accumulated around the center of the solder 280. As the solder 280 continues to solidify during the die attach process, the trapped gas bubbles 290 may become voids and stay permanently in the solidified solder 280 which attaches the chip 200 to the carrier 270.

The presence of the voids may reduce thermal and electrical conductivity, resulting in localized high electrical resistance and poor heat dissipation. Therefore, when the chip is in operation, it may invariably heat up due to poor heat dissipation. As a consequence, the chip may be damaged during operation. These problems may be more prominent for power devices, e.g., power ICs, having a thin substrate (e.g., about 60 μm) which operate at larger current. Localized heating at the vicinity of the voids becomes critical due to the very thin substrate. Such localized heating is likely to damage the chip during operation.

Figure 3:
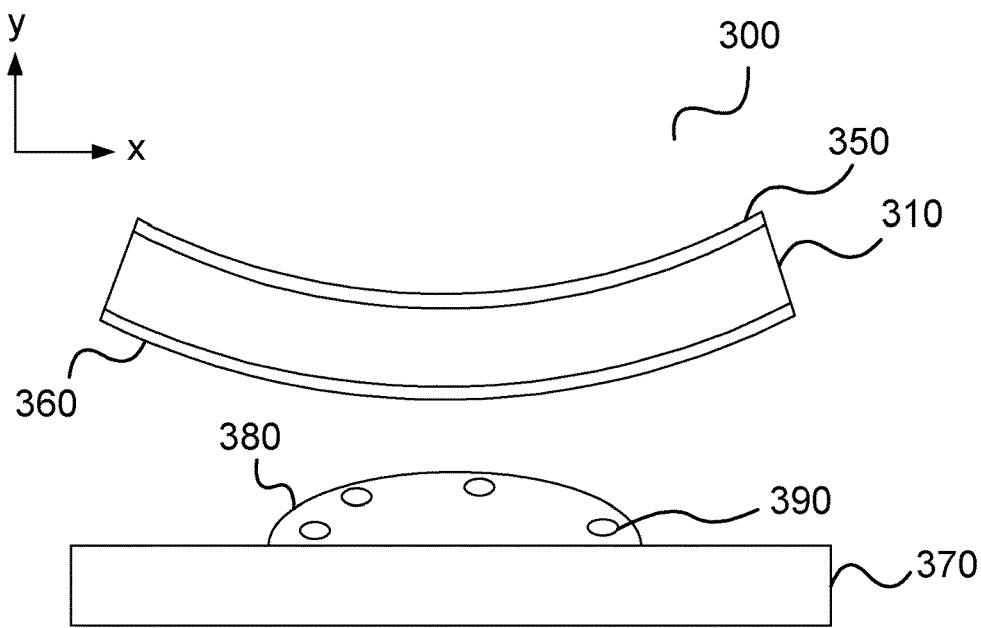
FIG. 3 shows an exemplary cross-sectional view of a device having a concave shape and a solder material on a carrier during a die attach process.

FIG. 3 shows an exemplary cross-sectional view of an upwardly bending chip having a concave shape and a molten solder on a carrier during a die attach process. The front side metallization structure 350 and the back side metallization structure 360 may have a higher coefficient of thermal expansion (CTE) than the CTE of the substrate 310. Therefore, during a die attach process which may be carried out at a temperature from about 150° C. to about 400° C., the front side metallization structure 350 and the back side metallization structure 360 may expand macroscopically more than the substrate 310. However, the front side metallization structure 350 and the back side metallization structure 360 may be constrained by the substrate 310 because the substrate 310 has a smaller CTE. As a result, the front side metallization structure 350 and the back side metallization structure 360 may be under compression during the die attach process. That is, the front side and back side metallization structures "want" to expand during the die attach process. The compressive stress exerted by the back side metallization structure 360 onto the substrate 310 may be increased according to various embodiments described herein. That is, the compressive stress exerted by the back side metallization structure 360 onto the substrate 310 may be increased so that it may be more dominant than the compressive stress exerted by the front side metallization structure 350 onto the substrate 310. As a result, the chip 300 may deviate from its initial planar state, forming an inverted dome over the molten solder 380 which is disposed on a carrier 370 (e.g., a PCB) at the die attach process.

Assuming the length of the chip is in the x direction and the height is in the y direction according to the Cartesian coordinate system, the deformed chip 300 may bend upwardly towards the positive y direction, e.g., the centre of the chip is closer to the carrier 370 than the edges of the chip. The deformed chip may adopt a concave shape as seen from the front side of the chip. Assuming the chip locates in between a center of curvature and the carrier 370, the radius of curvature of the deformed chip is therefore positive, as the chip bends upwardly towards the positive y direction. That is, the deformed chip 300 may have a positive radius of curvature during die attach process which is carried out at a specific temperature range, e.g., 150° C. to 400° C. In various embodiments, the positive radius of curvature may be in the range from about 0.5 m to about 3 m, which corresponds to a bow (or a curved surface) having a vertical deviation (in the y direction) from the lowest point on the bow in the range from about 5 μm to about 25 μm of a length of 100 mm (in the x direction).

The overhead inverted dome formed by the concave chip 300 may allow the gas bubbles 390 to escape from the molten solder 380 upwardly and outwardly during the die attach process. As a result, most of the air bubbles 390 may be able to escape from the molten solder 380 as the solder 280 continues to solidify during the die attach process. Consequently, less voids may be present in the solidified solder and the reliability of the chip may greatly be enhanced.

Figure 4:
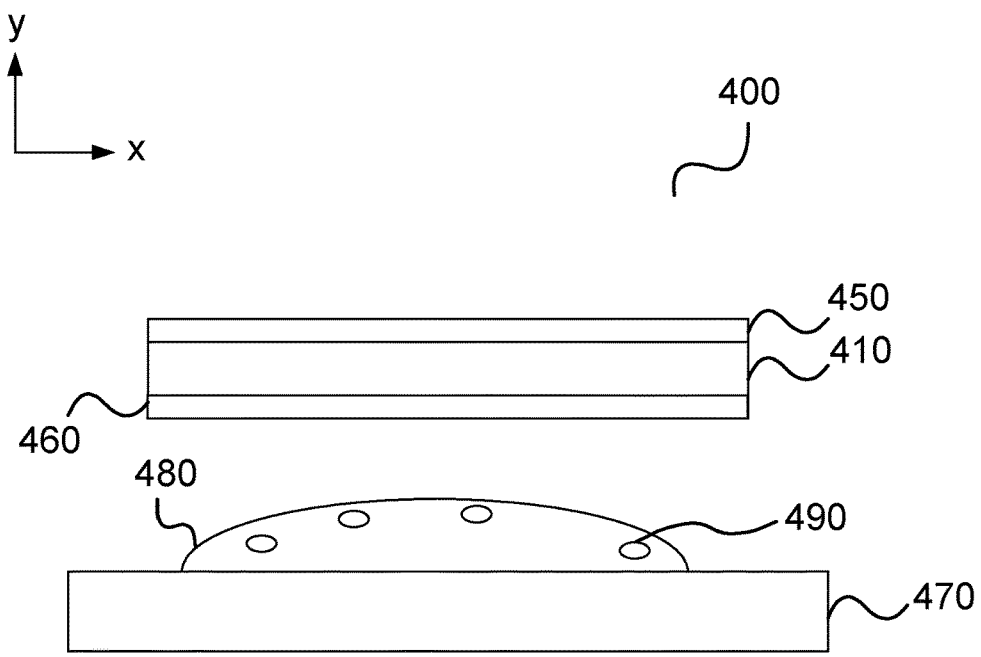
FIG. 4 shows an exemplary cross-sectional view of a device having planar top and bottom surfaces and a solder material on a carrier during a die attach process.

FIG. 4 shows an exemplary cross-sectional view of a flat chip having a planar top surface and a planar bottom surface and molten solder on a carrier during a die attach process. During the die attach process which may be carried out at a temperature from about 150° C. to about 400° C., the compressive stress exerted by the front side metallization structure 450 onto the substrate 410 may substantially be the same as the compressive stress exerted by the back side metallization structure 460 onto the substrate 410. As a result, the chip 400 may retain its initial planar state over the molten solder 480. That is, the chip 400 may retain its initial planar state during the die attach process which is carried out at a specific temperature range, e.g., 150° C. to 400° C.

Similar to the chip 300 having a concave shape as shown in FIG. 3, the chip 400 may allow the gas bubbles 490 to escape from the solder 480 upwardly and outwardly during the die attach process. As a result, less voids may be present in the solidified solder and the reliability of the chip may greatly be enhanced.

Figure 5:
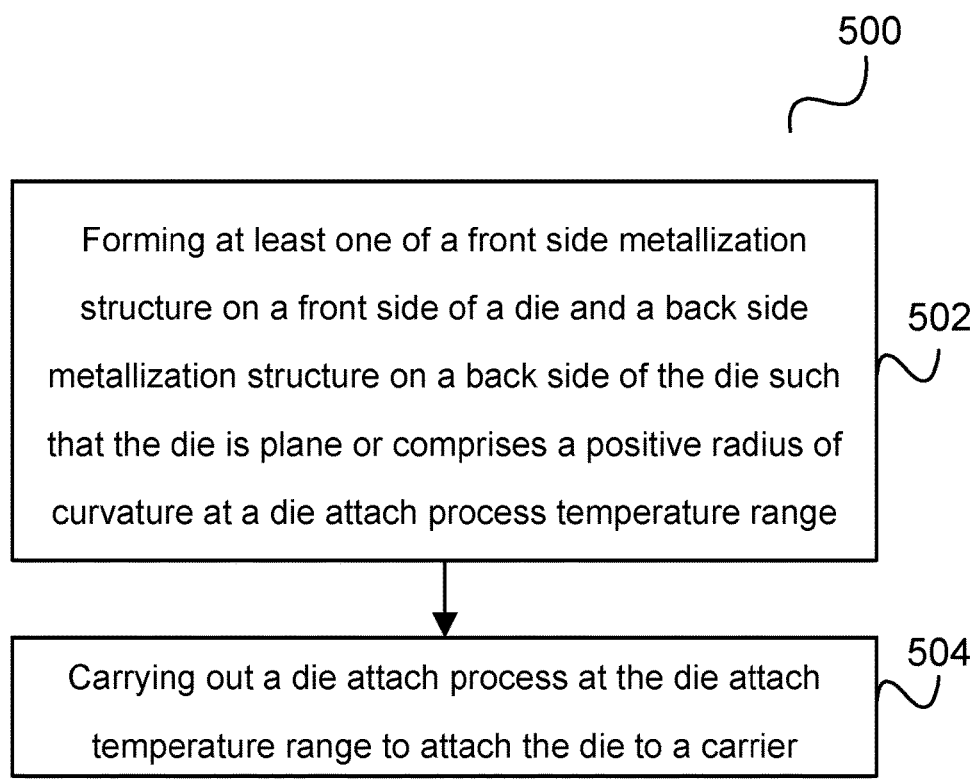
FIG. 5 shows an exemplary flow chart diagram of a method for processing a device.

FIG. 5 shows an exemplary flow chart diagram 500 of a method for processing a chip (or die) in accordance with various embodiments, so that the chip adopts a concave shape or retains its initial planar state during a die attach process as illustrated in FIGS. 3 and 4. It is to be noted that in the discussion of FIG. 5, continuing reference may be made to elements and reference numerals shown in FIGS. 3 and 4.

Referring to FIG. 5, at 502, at least one of a front side metallization structure may be formed on a front side of a die and a back side metallization structure may be formed on a back side of the die, such that the die is plane or has a positive radius of curvature at a die attach process temperature range.

In various embodiments, forming the least one of the front side metallization structure on the front side of the die and the back side metallization structure on a back side of the die may include depositing a metal over the at least one of the front side and back side of the die. The metal may be copper (Cu), tin (Sn), aluminum (Al), gold (Au), silver (Ag), nickel (Ni), platinum (Pt), their alloys, or a combination thereof. In various embodiments, copper may be used for depositing the front side metallization structure and nickel vanadium (NiV) may be used for depositing the back side metallization structure.

Metal deposition in various embodiments may, for example, be performed by sputtering, although it is not limited thereto. It will be appreciated that a variety of suitable deposition processes, techniques and systems thereof may be used to implement the teachings of the disclosure contained herein.

Figure 6:
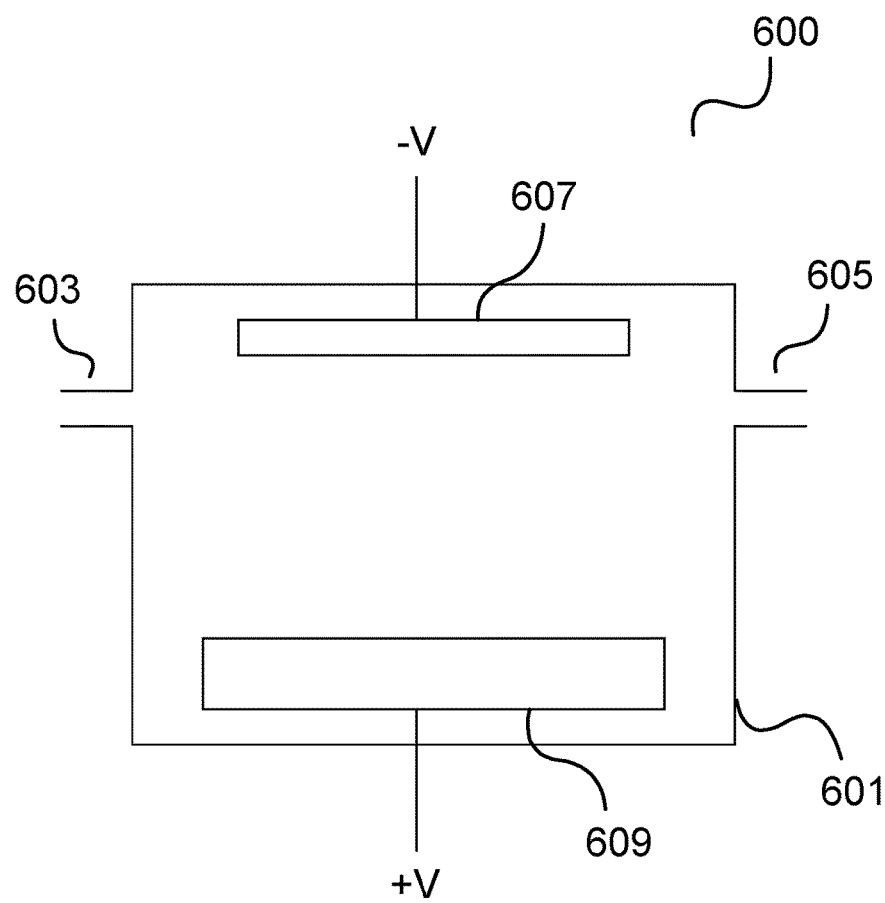
FIG. 6 shows an exemplary metal deposition system.

FIG. 6 shows an exemplary metal deposition system 600. For purposes of illustration, the exemplary metal deposition system 600 as shown is simplified. For instance, well-known features are omitted or simplified to clarify the description of the exemplary implementations and embodiments of the present disclosure, and to thereby better explain the exemplary implementations and embodiments.

The metal deposition system 600 may include a deposition chamber 601 having an inlet 603 and an outlet 605. Sputter gas (e.g., argon or any other inert/noble gases or for reactive sputtering, nitrogen gas may be useful) may be introduced into the chamber 601 via the inlet 603 and exhausted via the outlet 605. A sputtering target (or source) 607 may be provided in the chamber, for example, facing a substrate 609. The sputtering target 607 may include the material (e.g., a metal or metal alloy) to be deposited onto the surface of the substrate 609 facing the sputtering target 607. The sputtering target 607 may be biased with a negative voltage, whereas the substrate 609 may be biased with a positive voltage.

In various embodiments, the substrate 609 may be a semiconductor wafer having a plurality of chips (or dies) formed thereon. The chips may be power chips which are intended for high-power applications. As such, a front side metallization structure and a back side metallization structure may be disposed over the respective front side and back side of the chips. The front side metallization structure and the back side metallization structure may be formed using various deposition methods and systems, such as one that is shown in FIG. 6.

One or more deposition parameters (e.g., sputtering parameters which includes process gases) may be regulated so that the chip adopts a concave shape or retains its initial planar state during a die attach process which is carried out subsequently. For example, one or more deposition parameters may be regulated so that the deposited front side metallization structure may have different properties from the back side metallization structure. The deposition parameters may include composition of sputter gas, sputter gas pressure, sputtering voltage, substrate bias and etc.

In various embodiments, nitrogen gas ($N_2$) may be added during the deposition of the back side metallization structure. For example, $N_2$ gas may be added to the sputter gas (e.g., argon or any other inert/noble gases) during the deposition of back side metallization structure. The ratio of the $N_2$ gas flow to the inert gas flow may, for example, be in the range from about 5% to about 50%.

Neutralized ions and gas atoms, which may include nitrogen, may be embedded in the deposited back side metallization structure as impurities. The embedded impurities may impart residual stress (intrinsic stress) into the back side metallization structure. The residual stress may in turn increases the compressive stress exerted by the back side metallization structure onto the substrate during a die attach process which may be carried out at a specific temperature range, e.g., 150° C. to 400° C. In one or more embodiments, the compressive stress exerted by the back side metallization structure onto the substrate may be more dominant than the compressive stress exerted by the front side metallization structure onto the substrate during the die attach process. Such imbalance of the stress may cause the chip to undergo a change of geometry (i.e., bend upwardly), adopting a concave shape during the die attach process as illustrated in FIG. 3. In various other embodiments, the compressive stress exerted by the front side metallization structure onto the substrate may sufficiently compensate the compressive stress exerted by the back side metallization structure onto the substrate during the die attach process. As a result, the chip may retain its initial planar state during the die attach process as illustrated in FIG. 4.

In various embodiments, the sputter gas pressure may be regulated during the deposition of back side metallization structure. For example, the sputter gas pressure may be regulated from a first pressure range to a second pressure range during the deposition of the back side metallization structure. The first pressure range may be higher than the second pressure range. The first pressure range may, for example, be from about 0.5 Pa to 2 Pa and the second pressure range may, for example, be from about 0.05 Pa to 0.5 Pa.

The sputter gas pressure may have an impact on the deposition rate and composition of the deposited back side metallization structure. For example, reducing the sputter gas pressure may reduce the amount of ionized gas ions. However, the collisions between the ejected metal atoms and gas ions leads to self-ionization of the metal atoms, resulting in a self-ionizing plasma. The metal ions may impinge on the sputtering target in a ballistic manner and sputter off metal atoms having high kinetic energy. As a result, a back side metallization structure having a high density may be formed on the substrate. The dense back side metallization structure may exert more compressive stress onto the Si substrate during a die attach process which may be carried out at a specific temperature range, e.g., 150° C. to 400° C. In one or more embodiments, the compressive stress exerted by the back side metallization structure onto the substrate may be more dominant than the compressive stress exerted by the front side metallization structure during the die attach process. Such imbalance of the stress may cause the chip to undergo a change of geometry (i.e., bend upwardly), adopting a concave shape during the die attach process as illustrated in FIG. 3. In various other embodiments, the compressive stress exerted by the front side metallization structure onto the substrate may sufficiently compensate the compressive stress exerted by the back side metallization structure during die attach process. As a result, the chip may retain its initial planar state during the die attach process as illustrated in FIG. 4.

In various embodiments, the sputtering voltage may be regulated during the deposition of back side metallization structure. For example, the sputtering power may be regulated from a first voltage range to a second voltage range during the deposition of the back side metallization structure. The first voltage range may be lower than the second voltage range. The first voltage range may, for example, be about 0.5 kV to 0.8 kV and the second voltage range may, for example, be about 0.8 kV to 1.5 kV.

The sputtering voltage may have impact on the deposition rate and composition of the deposited back side metallization structure. For example, increasing the sputtering voltage may increase the energy of the ejected metal atoms, thus forming a back side metallization structure having a high density on the substrate. The dense back side metallization structure exerts more compressive stress onto the substrate during a die attach process which may be carried out at a specific temperature range, e.g., 150° C. to 400° C. In one or more embodiments, the compression stress exerted by the back side metallization structure onto the substrate is more dominant than the compressive stress exerted by the front side metallization structure during the die attach process. Such imbalance of the stress may cause the chip to undergo a change of geometry (i.e., bend upwardly), adopting a concave shape during die attach process as illustrated in FIG. 3. In various other embodiments, the compressive stress exerted by the front side metallization structure onto the substrate may sufficiently compensate the compressive stress exerted by the back side metallization structure during the die attach process. As a result, the chip may retain its initial planar state during the die attach process as illustrated in FIG. 4.

In various embodiments, the one or more deposition parameters may be prioritized and selectively executed according to various product requirements, such as the choice of metal or metal alloy, substrate and application. In various embodiments, the one or more deposition parameters may be executed at the same time, i.e., concurrently. Furthermore, it is to be noted that the regulated deposition parameters are within the pre-determined process control limits.

For purposes of illustration, the various embodiments are described in the context of forming the back side metallization structure. However, it should be noted that the teaching may also be applied to forming the front side metallization structure. In various embodiments, the one or more deposition parameters may be regulated during the deposition of the front side metallization structure, so that the chip may adopt a concave shape or retain its initial planar state during the die attach process. For example, either the sputter gas pressure may be increased or the sputtering voltage may be decreased or both during the formation of the front side metallization structure, so that the compressive stress exerted by the back side metallization structure onto the substrate may be greater than or substantially the same as the compressive stress exerted by the back side metallization structure during the die attach process.

In various embodiments, the one or more deposition parameters may be regulated during the deposition of the front side metallization structure and the back side metallization structure, so that the chip may adopt a concave shape or retain its initial planar state during the die attach process.

In various embodiments, the front side and back side metallization structures may be the same metal or metal alloy having different thicknesses. For example, the front side metallization structure may have a smaller thickness than the back side metallization structure. Thus, the back side metallization structure may exert more compressive stress onto the substrate during a die attach process which may be carried out at a specific temperature range, e.g., 150° C. to 400° C. As a result, the chip may undergo a change in geometry (i.e., bend upwardly) to adopt a concave shape during die attach process as illustrated in FIG. 3 or to retain its initial planar state during the die attach process as illustrated in FIG. 4.

In various embodiments, the front side and back side metallization substrate may be different metals or metal alloy having different coefficients of thermal expansion (CTEs). For example, the back side metallization structure may have a larger CTE than the front side metallization structure. Thus, the back side metallization structure expands more than the front side metallization structure during a die attach process which may be carried out at a specific temperature range, e.g., 150° C. to 400° C. As a result, the chip may undergo a change in geometry (i.e., bend upwardly) to adopt a concave shape during die attach process as illustrated in FIG. 3 or to retain its initial planar state during the die attach process as illustrated in FIG. 4.

In various embodiments, the front side metallization structure and back side metallization structure may each include a plurality of sublayers. Each of the sublayers may be the same metal (or metal alloy) or different metals and each of the sublayers may have the same thickness or different thicknesses, depending on the stress caused by each respective sublayer and as long as the conditions as illustrated in FIGS. 3 and 4 are achieved during a die attach process may be carried out at a specific temperature range, e.g., 150° C. to 400° C.

After forming the at least one of the front side and back side metallization structure, the substrate having the plurality of chips may be diced. It will be appreciated that a variety of suitable dicing processes, techniques and systems thereof may be used to singulate the plurality of chips from the substrate.

Referring to FIG. 5, at 504, a die attach process is carried out at the die attach temperature range to attach the singulated chip to a carrier. In various embodiments, the die attach temperature is in the range from about 150° C. to about 400° C., e.g., from about 250° C. to about 350° C. The chip, in one or more embodiments, may adopt a concave shape or retains its initial planar state during the die attach process as illustrated in FIGS. 3 and 4.

In various embodiments, the embedded impurities which may include nitrogen, may impart residual stress into the back side metallization layer. The residual stress may increase the compressive stress the back side metallization structure exerted onto the substrate during a die attach process which may be carried out at a specific temperature range, e.g., 150° C. to 400° C. Therefore, the compressive stress exerted by the back side metallization substrate onto the substrate may be more dominant than the compression stress exerted by the front side metallization structure onto the substrate during the die attach process. As a result, the chip may deviate from its initial planar state. In various embodiments, the chip may bend upwardly, forming an inverted dome over the molten solder during the die attach process. The deformed chip may adopt a concave shape as illustrated in FIG. 3. That is, the deformed chip may have a positive radius of curvature during the die attach process which is carried out at a specific temperature range, e.g., 150° C. to 400° C.

In various embodiments, the back side metallization structure having a high density which may be obtained by regulating the sputter gas pressure and/or sputtering voltage as discussed previously, may exert more compressive stress onto the substrate during a die attach process which may be carried out at a specific temperature range, e.g., 150° C. to 400° C. Therefore, the compressive stress exerted by the back side metallization structure onto the substrate may be more dominant than the compressive stress exerted by the front side metallization structure onto the substrate. As a result, the chip may deviate from its initial planar state. In various embodiments, the chip bends upwardly to form an inverted dome over the molten solder during the die attach process. The deformed chip may adopt a concave shape as illustrated in FIG. 3. That is, the deformed chip may have a positive radius of curvature during the die attach process which is carried out at a specific temperature range, e.g., 150° C. to 400° C.

The back side metallization structure may have a larger thickness than the front side metallization structure. During the die attach process which is carried out at a specific temperature range, e.g., 150° C. to 400° C., the back side metallization structure may exert more compression stress onto the substrate. As a result, the chip may deviate from its initial planar state and bend upwardly to form an inverted dome over the molten solder during the die attach process. The deformed chip may adopt a concave shape as illustrated in FIG. 3. That is, the deformed chip may have a positive radius of curvature during the die attach process which is carried out at a specific temperature range, e.g., 200° C. to 400° C.

The back side metallization structure may have a larger CTE and/or larger thickness than the front side metallization structure. During the die attach process which is carried out at a specific temperature range, e.g., 200° C. to 400° C., the back side metallization structure may expand more than the front side metallization structure. As a result, the chip may deviate from its initial planar state and bend upwardly to form an inverted dome over the molten solder during the die attach process. The deformed chip may adopt a concave shape as illustrated in FIG. 3. That is, the deformed chip may have a positive radius of curvature during the die attach process which is carried out at a specific temperature range, e.g., 200° C. to 400° C.

In various embodiments, the compressive stress exerted by the front side metallization structure onto the substrate may sufficiently compensate the compressive stress exerted by the back side metallization structure during die attach process. As a result, the chip retains its initial planar state during die attach process as illustrated in FIG. 4.

The overhead inverted dome formed by the concave chip may allow the gas bubbles due to outgassing to escape from the molten solder upwardly and outwardly during the die attach process which may be carried out at a specific temperature range, e.g., 150° C. to 400° C., as illustrated in FIG. 3. Similarly, the planar chip as shown in FIG. 4 may also allow the air bubbles to escape from the solder upwardly and outwardly during the die attach process. As a result, most of the air bubbles may be able to escape from the molten solder as the solder continues to solidify during the die attach process. Consequently, less voids may be present in the solidified solder and the reliability of the chip may greatly be enhanced.

After the die attach process, the chip attached to the carrier may be cooled to a temperature below the die attach process temperature range. In various embodiments, the chip attached to the carrier may be cooled to room temperature. The chip having a concave shape during the die attach process may return to it's initial planar states when it is cooled to a solidification temperature of the molten solder at temperatures in the range of 150° C. to 280° C. below the die attach process temperature range.

After attaching the chip to the carrier and cooling the chip to a temperature range lower than the die attach process temperature, conventional backend processes, such as underfill, encapsulation may be carried out to produce a package.

Figure 7:
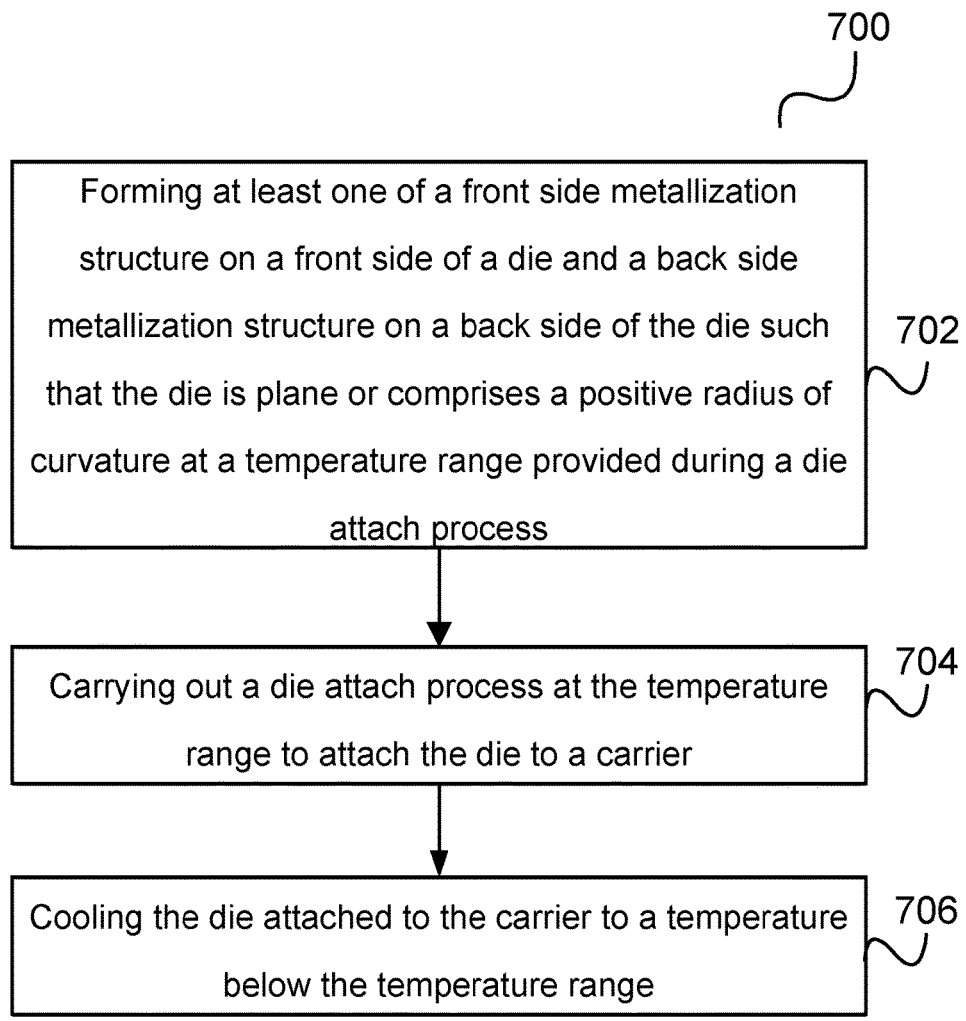
FIG. 7 shows an exemplary flow chart diagram of a method for processing a device.

FIG. 7 shows an exemplary flow chart diagram 700 of a method for processing a chip (or die) in accordance with various embodiments, so that the chip adopts a concave shape or retains its initial planar state during die attach process as illustrated in FIGS. 3 and 4.

At 702, at least one of a front side metallization structure may be formed on a front side of the die and a back side metallization structure may be formed on a back side of the die such that the die is plane or comprises a positive radius of curvature at a temperature range provided during a die attach process.

At 704, a die attach process may be carried out at the temperature range to attach the die to a carrier.

At 706, the die attached to the carrier may be cooled to a temperature below the temperature range.

Figure 8:
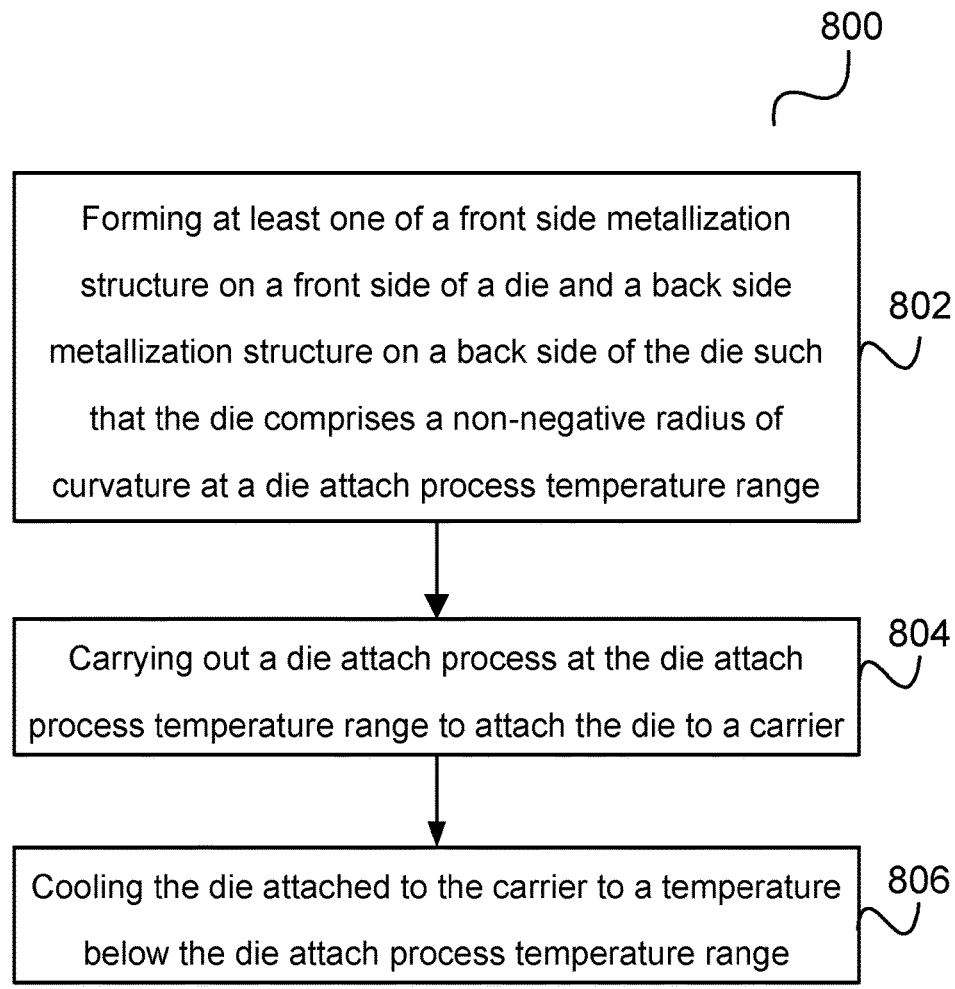
FIG. 8 shows an exemplary flow chart diagram of a method for attaching a die to a carrier.

FIG. 8 shows an exemplary flow chart diagram 800 of a method for for attaching a die to a carrier in accordance with various embodiments, so that the chip adopts a concave shape or retains its initial planar state during die attach process as illustrated in FIGS. 3 and 4.

At 802, at least one of a front side metallization structure may be formed on a front side of the die and a back side metallization structure may be formed on a back side of the die such that the die comprises a non-negative radius of curvature at a die attach process temperature range.

At 804, a die attach process may be carried out at the die attach process temperature range to attach the die to a carrier.

At 806, the die attached to the carrier may be cooled to a temperature below the die attach process temperature range.

An experiment was conducted. The experiment includes a plurality of test cases.

Figure 9:
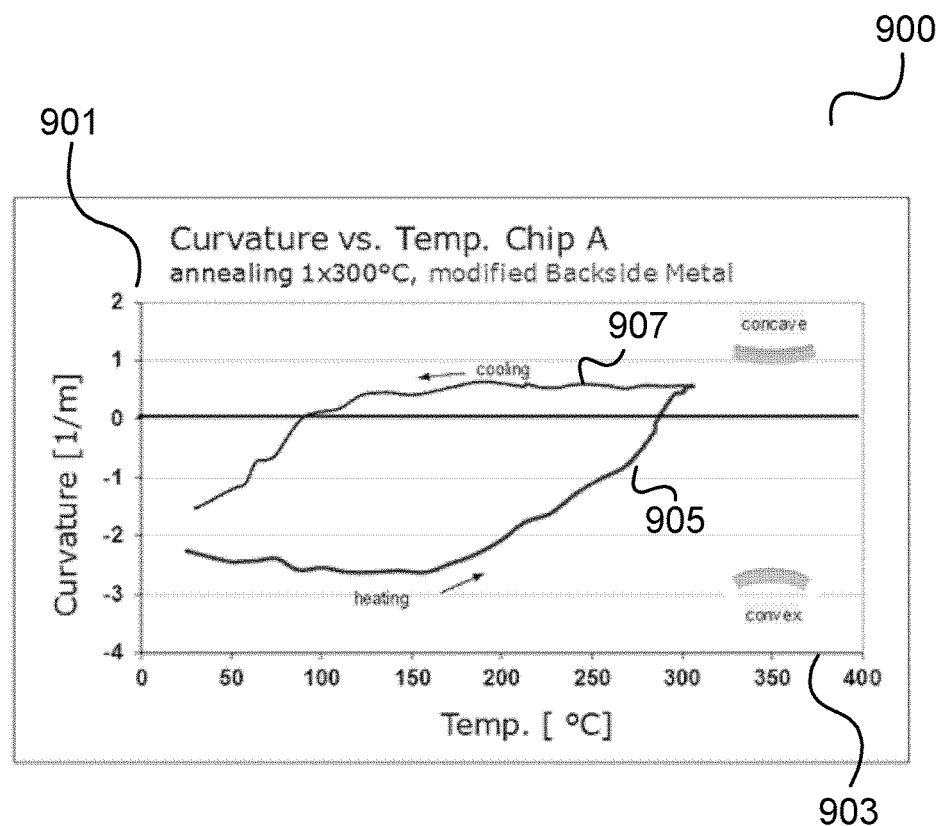
FIG. 9 shows an exemplary test case.

FIG. 9 shows an exemplary test case 900. The chip (i.e., Chip A) used in the test case 900 includes a modified back side metallization structure. For example, the back side metallization structure is modified in accordance to various embodiments as described herein. The radius of curvature 901 of Chip A is measured against the temperature 903 during a die attach process and after the die attach process. The heating profile and cooling profile are represented by curve 905 and 907, respectively. As depicted by curve 905, the radius of curvature of Chip A remains negative up to a temperature of approximately 280° C., indicating that the chip is adopting a convex shape as shown in FIG. 2. Curve 905 further depicts that the radius of curvature of Chip A becomes positive after the temperature rises to above 280° C., indicating that the chip is adopting a concave shape as shown in FIG. 3. As depicted by curve 907, the radius of curvature of the chip changes from positive to negative during cooling after the die attach process.

Figure 10:
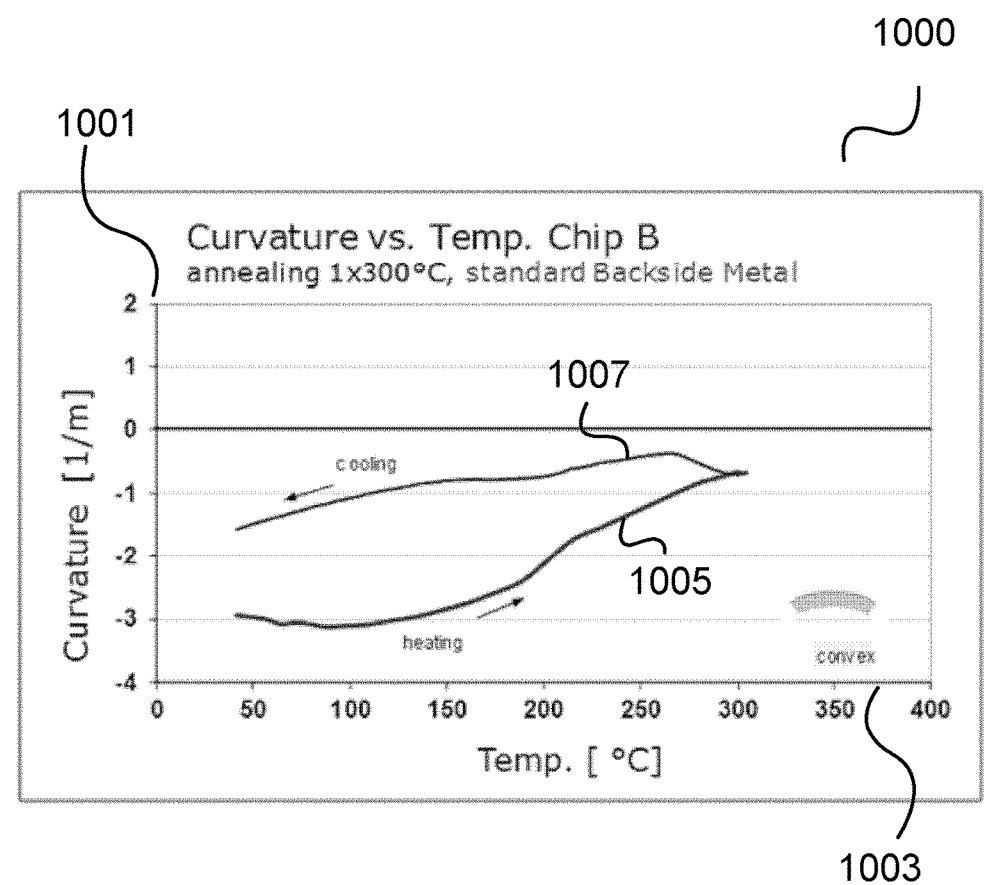
FIG. 10 shows an exemplary test case.

FIG. 10 shows an exemplary test case 1000. The chip (i.e., Chip B) used in the test case 1000 has a standard (conventional) back side metallization structure. The radius of curvature 1001 of Chip B is measured against the temperature 1003 during a die attach process and after the die attach process. The heating profile and cooling profile are represented by curve 1005 and 1007, respectively. As depicted by curves 1005 and 1007, the radius of curvature of Chip B remains negative during the entire die attach process and after the die attach process, indicating that the chip is adopting a convex shape as shown in FIG. 2.

A die in accordance with an embodiment may include: a die body; and at least one of a front side metallization structure on a front side of the die body and a back side metallization structure on a back side of the die body such that the die is plane or comprises a positive radius of curvature at a die attach process temperature range.

In an example of this embodiment, the die body may include a semiconductor substrate.

In a further example of this embodiment, the die attach process temperature range may be from about 150° C. to about 400° C.

In a further example of this embodiment, a coefficient of thermal expansion of the front side metallization structure may be smaller than a coefficient of thermal expansion of the back side metallization structure.

In a further example of this embodiment, the front side metallization structure and the back side metallization structure may include the same material, and the front side metallization structure may include a thickness smaller than a thickness of the back side metallization structure.

In a further example of this embodiment, the front side metallization structure may include a stack of multiple sublayers or a plurality of stacks, each stack may have multiple sublayers, and the back side metallization structure may include a stack of multiple sublayers or a plurality of stacks, each stack may have multiple sublayers.

In a further example of this embodiment, the front side metallization structure may include copper, tin, aluminum, gold, silver, nickel, platinum, their alloys, or a combination thereof.

In a further example of this embodiment, the back side metallization structure may include copper, tin, aluminum, gold, silver, nickel, platinum, their alloys, or a combination thereof.

In a further example of this embodiment, the front side metallization structure may include copper and the back side metallization structure may include nickel vanadium.

In a further example of this embodiment, the back side metallization structure may include nitrogen impurities.

In a further example of this embodiment, the positive radius of curvature of the die may be from about 0.5 m to about 3 m.

A die arrangement in accordance with an embodiment may include: a carrier and a die attached to the carrier. The die may include a die body, and at least one of a front side metallization structure disposed on a front side of the die body and a back side metallization structure disposed on a back side of the die body such that the die is plane or includes a positive radius of curvature at a die attach process temperature range.

In an example of this embodiment, the carrier may include a printed circuit board.

In a further example of this embodiment, the die body may include a semiconductor substrate.

In a further example of this embodiment, the die attach process temperature range may be from about 150° C. to about 400° C.

In a further example of this embodiment, a coefficient of thermal expansion of the front side metallization structure may be smaller than a coefficient of thermal expansion of the back side metallization structure.

In a further example of this embodiment, the front side metallization structure and the back side metallization structure may include the same material, and the front side metallization structure may include a thickness smaller than a thickness of the back side metallization structure.

In a further example of this embodiment, the front side metallization structure may include a stack of multiple sublayers or a plurality of stacks, each stack may have multiple sublayers, and the back side metallization structure may include a stack of multiple sublayers or a plurality of stacks, each stack may have multiple sublayers.

In a further example of this embodiment, the back side metallization structure may include nitrogen impurities.

A die arrangement in accordance with another embodiment may include: a carrier, and a die attached to the carrier. The die may include a die body, and at least one of a front side metallization structure disposed on a front side of the die body and a back side metallization structure disposed on a back side of the die body. The die may include a positive radius of curvature with respect to the surface of the carrier.

A method for processing a die in accordance with an embodiment may include: forming at least one of a front side metallization structure on a front side of the die and a back side metallization structure on a back side of the die such that the die is plane or includes a positive radius of curvature at a die attach process temperature range; and carrying out a die attach process at the die attach process temperature range to attach the die to a carrier.

In an example of this embodiment, the die attach process temperature range may be from about 150° C. to about 400° C.

In a further example of this embodiment, forming the at least one of a front side metallization structure on a front side of the die and a back side metallization structure on a back side of the die may include depositing a metal onto the at least one of a front side of the die and a back side of the die and regulating one or more deposition parameters.

In a further example of this embodiment, regulating the one or more deposition parameters may include regulating a sputter gas pressure.

In a further example of this embodiment, regulating the one or more deposition parameters may include regulating a sputtering power.

In a further example of this embodiment, regulating the one or more deposition parameters may include introducing nitrogen gas when sputtering the metal onto the front side or back side of the die.

In a further example of this embodiment, a coefficient of thermal expansion of the front side metallization structure may be smaller than a coefficient of thermal expansion of the back side metallization structure.

In a further example of this embodiment, the front side metallization structure and the back side metallization structure may include the same material and the front side metallization structure may have a thickness smaller than a thickness of the back side metallization structure.

In a further example of this embodiment, the front side metallization structure may include a stack of multiple sublayers or a plurality of stacks, each stack may have multiple sublayers, and the back side metallization structure may include a stack of multiple sublayers or a plurality of stacks, each stack may have multiple sublayers.

A method for processing a die in accordance with another embodiment may include: forming at least one of a front side metallization structure on a front side of the die and a back side metallization structure on a back side of the die such that the die is plane or includes a positive radius of curvature at a temperature range provided during a die attach process; carrying out a die attach process at the temperature range to attach the die to a carrier; and cooling the die attached to the carrier to a temperature below the temperature range.

In an example of this embodiment, the temperature range may be from about 150° C. to about 400° C.

In a further example of this embodiment, forming the at least one of a front side metallization structure on a front side of the die and a back side metallization structure on a back side of the die may include depositing a metal onto the at least one of a front side of the die and a back side of the die and regulating one or more deposition parameters.

In a further example of this embodiment, regulating the one or more deposition parameters may include regulating a sputter gas pressure.

In a further example of this embodiment, regulating the one or more deposition parameters may include regulating a sputtering power.

In a further example of this embodiment, regulating the one or more deposition parameters may include introducing nitrogen gas when sputtering the metal onto the front side or back side of the die.

In a further example of this embodiment, a coefficient of thermal expansion of the front side metallization structure may be smaller than a coefficient of thermal expansion of the back side metallization structure.

In a further example of this embodiment, the front side metallization structure and the back side metallization structure may include the same material and the front side metallization structure may have a thickness smaller than a thickness of the back side metallization structure.

A method for attaching a die to a carrier in accordance with an embodiment may include forming at least one of a front side metallization structure on a front side of the die and a back side metallization structure on a back side of the die such that the die includes a non-negative radius of curvature at a die attach process temperature range; carrying out a die attach process at the die attach process temperature range to attach the die to a carrier; and cooling the die attached to the carrier to a temperature below the die attach process temperature range.

In an example of this embodiment, the die attach process temperature range may be from about 150° C. to about 400° C.

In a further example of this embodiment, forming the at least one of a front side metallization structure on a front side of the die and a back side metallization structure on a back side of the die may include depositing a metal onto the at least one of a front side of the die and a back side of the die and regulating one or more deposition parameters.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die, comprising:
   a die body; and
   at least one of a front side metallization structure on a front side of the die body and a back side metallization structure on a back side of the die body such that the die is configured to be planar at a die attach process temperature range or to have a positive radius of curvature at the die attach process temperature range, wherein the back side metallization structure is electrically conductive and comprises impurities configured to exert a compressive stress onto the die body that is greater than a compressive stress of the front side metallization structure at the die attach process temperature range.

2. The die of claim 1,
   wherein the die body comprises a semiconductor substrate.

3. The die of claim 1,
   wherein the die attach process temperature range is from about 150° C. to about 400° C.

4. The die of claim 1,
   wherein a coefficient of thermal expansion of the front side metallization structure is smaller than a coefficient of thermal expansion of the back side metallization structure.

5. The die of claim 1,
   wherein the front side metallization structure and the back side metallization structure comprise the same material; and
   wherein the front side metallization structure comprises a thickness smaller than a thickness of the back side metallization structure.

6. The die of claim 1,
   wherein the front side metallization structure comprises a stack of multiple sublayers or a plurality of stacks, each stack having multiple sublayers; and
   wherein the back side metallization structure comprises a stack of multiple sublayers or a plurality of stacks, each stack having multiple sublayers.

7. The die of claim 1,
   wherein the front side metallization structure comprises copper, tin, aluminum, gold, silver, nickel, platinum, their alloys, or a combination thereof.

8. The die of claim 1,
   wherein the back side metallization structure comprises copper, tin, aluminum, gold, silver, nickel, platinum, their alloys, or a combination thereof.

9. The die of claim 1,
   wherein the front side metallization structure comprises copper and the back side metallization structure comprises nickel vanadium.

10. The die of claim 1,
    wherein the positive radius of curvature of the die is from about 0.5 m to about 3 m.

11. The die arrangement of claim 1,
    wherein a material or composite material of the back side metallization structure has a higher density than that of the front side metallization structure and is configured to exert a compressive stress onto the die body that is greater than a compressive stress of the front side metallization structure at the die attach process temperature.

12. The die of claim 1,
    wherein the impurities comprise nitrogen.

13. A die arrangement, comprising:
    a carrier; and
    a die attached to the carrier, the die comprising:
    a die body; and
    at least one of a front side metallization structure disposed on a front side of the die body and a back side metallization structure disposed on a back side of the die body such that the die is configured to be planar at a die attach process temperature range or to have a positive radius of curvature at the die attach process temperature range,
    wherein the back side metallization structure is electrically conductive and comprises impurities configured to exert a compressive stress onto the die body that is greater than a compressive stress of the front side metallization structure at the die attach process temperature range.

14. The die arrangement of claim 13,
    wherein the carrier comprises a printed circuit board.

15. The die arrangement of claim 13,
    wherein the die attach process temperature range is from about 150° C. to about 400° C.

16. The die arrangement of claim 13,
    wherein a coefficient of thermal expansion of the front side metallization structure is smaller than a coefficient of thermal expansion of the back side metallization structure.

17. The die arrangement of claim 13,
    wherein the front side metallization structure and the back side metallization structure comprise the same material, and
    wherein the front side metallization structure comprises a thickness smaller than a thickness of the back side metallization structure.

18. The die arrangement of claim 13,
wherein the front side metallization structure comprises a stack of multiple sublayers or a plurality of stacks, each stack having multiple sublayers, and
wherein the back side metallization structure comprises a stack of multiple sublayers or a plurality of stacks, each stack having multiple sublayers.

19. The die arrangement of claim 13,
wherein the impurities comprise nitrogen.

* * * * *